(12) United States Patent
Richter

(10) Patent No.: US 10,458,421 B2
(45) Date of Patent: Oct. 29, 2019

(54) COOLING FAN ILLUMINATED WITH ADDRESSABLE LEDS

(71) Applicant: Paul Daniel Richter, Mesa, AZ (US)

(72) Inventor: Paul Daniel Richter, Mesa, AZ (US)

( * ) Notice: Subject to any disclaimer, the term of this patent is extended or adjusted under 35 U.S.C. 154(b) by 378 days.

(21) Appl. No.: 15/188,401

(22) Filed: Jun. 21, 2016

(65) Prior Publication Data

US 2016/0369809 A1 Dec. 22, 2016

Related U.S. Application Data

(60) Provisional application No. 62/182,859, filed on Jun. 22, 2015.

(51) Int. Cl.
*F04D 29/00* (2006.01)
*F04D 25/08* (2006.01)
(Continued)

(52) U.S. Cl.
CPC ........... *F04D 29/005* (2013.01); *F04D 25/08* (2013.01); *F04D 29/403* (2013.01); *F04D 29/526* (2013.01); *G06F 1/203* (2013.01); *H05K 7/20136* (2013.01); *H05K 7/20172* (2013.01); *F04D 25/0613* (2013.01)

(58) Field of Classification Search
CPC . G06F 1/203; G06F 1/20; G06F 1/206; G06F 2200/201; G06F 2200/202; G06F 2200/203; F04D 27/004; F04D 25/0613; F04D 29/005; F04D 19/002; F04D 25/06; F04D 25/0606; F04D 25/08;
(Continued)

(56) References Cited

U.S. PATENT DOCUMENTS 6,349,385 B1 *  2/2002  Kaminski ............... G06F 1/206
                                                      713/300
8,092,155 B2 *  1/2012  Tsen .................... F04D 25/0613
                                                      415/118

(Continued)

OTHER PUBLICATIONS

Enermax T.B. Vegas Quad data sheet, available at http://www.enermaxusa.com:80/downloads/datasheet_uctvq18a.pdf, at least as early as Mar. 19, 2013, now available at: https://web.archive.org/web/20130319145928/http://www.enermaxusa.com:80/downloads/datasheet_uctvq18a.pdf.*

(Continued)

*Primary Examiner* — Bryan M Lettman
(74) *Attorney, Agent, or Firm* — Brad Bertoglio

(57) ABSTRACT

A cooling fan is illuminated by addressable LEDs, which allows interactive control of the LEDs from a connected controller to create variable lighting effects on the fan impeller. The fan may include a frame, an electrical motor, an impeller, and addressable LEDs. The LEDs may be positioned around the periphery of a fan central cavity in which the impeller rotates. The LEDs may be mounted on a flexible circuit substrate that also forms a fan shroud. The addressable LEDs face towards the rotational axis of the motor, and can apply variable illumination of the impeller. The fan can be used to provide cooling to host device components and accessories, such as those related to a personal computer, while also providing interactive, decorative LED lighting and effects and/or conveying information concerning system operation, such as temperature, load, and queued email or instant messages.

12 Claims, 4 Drawing Sheets

(51) Int. Cl.
  *F04D 29/52* (2006.01)
  *H05K 7/20* (2006.01)
  *G06F 1/20* (2006.01)
  *F04D 29/40* (2006.01)
  *F04D 25/06* (2006.01)

(58) Field of Classification Search
  CPC ...... F04D 29/403; F04D 29/52; F04D 29/522; F04D 29/526; H05K 7/20136; H05K 7/20172
  See application file for complete search history.

(56) References Cited

U.S. PATENT DOCUMENTS

| | | | | |
|---|---|---|---|---|
| 2003/0120394 | A1* | 6/2003 | Ziarnik | G05D 23/1912 700/300 |
| 2005/0213302 | A1* | 9/2005 | Lin | G06F 1/203 361/695 |
| 2005/0289372 | A1* | 12/2005 | Park | G06F 1/206 713/300 |
| 2006/0133920 | A1* | 6/2006 | Chen | F04D 25/0613 415/76 |
| 2011/0090642 | A1* | 4/2011 | Chen | G06F 1/206 361/679.48 |
| 2011/0121983 | A1* | 5/2011 | Chen | F04D 29/582 340/635 |
| 2012/0026677 | A1* | 2/2012 | Bhutani | F04D 25/0613 361/679.48 |
| 2014/0178200 | A1* | 6/2014 | Huang | F04D 27/001 416/39 |
| 2016/0154164 | A1 | 6/2016 | Lin | |

OTHER PUBLICATIONS

Enermax, materials describing T.B. Vegas illuminated fan available at web site http://www.enermax.com. (Downloaded Jun. 15, 2016; documents dated on their face 2012 and 2013).

* cited by examiner

COOLING FAN ILLUMINATED WITH ADDRESSABLE LEDS

TECHNICAL FIELD

The present disclosure relates in general to electronics hardware, and in particular to a cooling fan illuminated with addressable LEDs.

BACKGROUND

Currently there are a number of cooling fans available for use in consumer electronic devices such as personal computers, of various sizes, that have a number of single color LEDs adjacent to or around a fan frame, that in some way illuminate the fan impeller for decorative purposes. These solutions have been on the market for many years. During that time, the PC market has changed considerably. Laptop PCs have grown in popularity and now dominate office use. Desktop PCs are now mostly owned by hardcore gamers and custom PC builders who seek to add creative flair to their personal computer creations, to set them apart from those obtained via retail outlets and even to compete with each other. Therefore, artistic expression and differentiation are increasingly valuable.

Some solutions offer single color LEDs of different colors in the same fans, but these single color LEDs typically provide no blending opportunities and special effects (if offered at all) may be simple and pre-configured. To the extent that solutions may offer RGB LEDs, they may only provide very simple preprogrammed variations with little capability for creative expression.

SUMMARY

Therefore, there currently exists a need on the market for LED fans that could be used to produce a plurality of LED states of color and effects that would be interactive with the status or condition of the programs running on and hardware status of the host personal computer system. In accordance with one embodiment, a cooling fan includes an array of software-addressable LEDs around the periphery of a central cavity. An impeller is positioned within the central cavity, and is spun by an electric motor. A fan controller input receives signals driving time-variable, individually-addressable illumination of each LED. The LEDs may be generally co-planar with a centerline of the impeller, providing even illumination of the impeller. The LEDs may be mounted on a flexible circuit substrate that also forms a fan shroud around the impeller. The LEDs may be single-color LEDs; in such cases, the LEDs are preferably approximately equally spaced around the periphery of the central cavity, and are sufficiently close to enable color blending via simultaneous illumination of adjacent LEDs. In some embodiments, the separation between adjacent LEDs will be no more than approximately 45 degrees (e.g. 8 equally-spaced LEDs). In other embodiments, greater numbers of LEDs may be utilized, such as 24, 36 or 48. The LEDs may alternatively be variable-color LEDs, such as RGB LEDs; in such cases, the fan control input includes both LED illumination state and color specifications for each LED.

Electronic devices incorporating cooling fans with software-addressable LEDs are also described herein. The host electronic device may include a microprocessor, which implements a controller driver. The controller driver receives system events from a host device operating system and/or application software, and outputs an associated control signal which is conveyed to a controller unit, which may be installed with the fan in the host electronic device, such as within a case of a personal computer. The controller driver inputs may include, e.g., signals from other applications operating on the host electronic device (such as, e.g., email application new message waiting indicators, or game player health status indicators), signals indicative of host device component status (such as component temperature), and/or other inputs. The controller unit generates a fan control signal based at least in part on the controller driver output. Time-variable LED control signals can be provided, to vary LED color and illumination status over time.

Embodiments of the present invention will now be described more fully hereinafter with reference to the accompanying drawings, which are intended to be read in conjunction with both this summary, the detailed description and any preferred and/or particular embodiments specifically discussed or otherwise disclosed. This invention may, however, be embodied in many different forms and should not be construed as limited to the embodiments set forth herein; rather, these embodiments are provided by way of illustration only and so that this disclosure will be thorough, complete and will fully convey the full scope of the invention to those skilled in the art.

DETAILED DESCRIPTION OF THE DRAWINGS

Figure 1A:
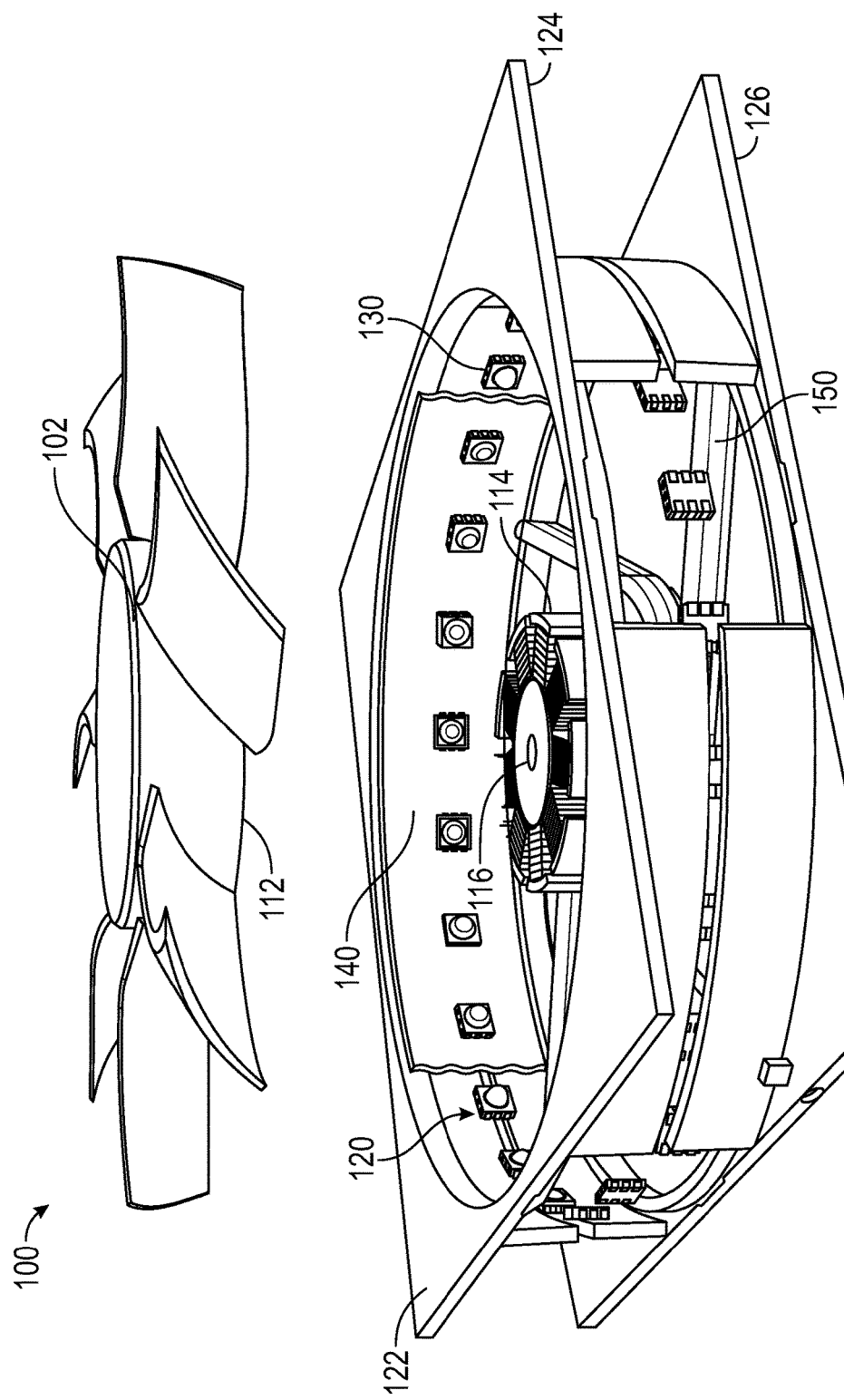
FIG. 1A is a partially-exploded perspective view of an illuminated fan with addressable LEDs.

While this invention is susceptible to embodiment in many different forms, there are shown in the drawings and will be described in detail herein several specific embodiments, with the understanding that the present disclosure is to be considered as an exemplification of the principles of the invention to enable any person skilled in the art to make and use the invention, and is not intended to limit the invention to the embodiments illustrated.

A cooling fan can be illuminated with addressable LEDs. The addressable LEDs, alone and in various combinations, can provide a plurality of LED states of color on the fan to create numerous different visual effects. In some applications, the visual effects may be controlled by inputs including the status or condition of software running on a host personal computer system, and/or the status of various computer system hardware components.

Figure 1B:
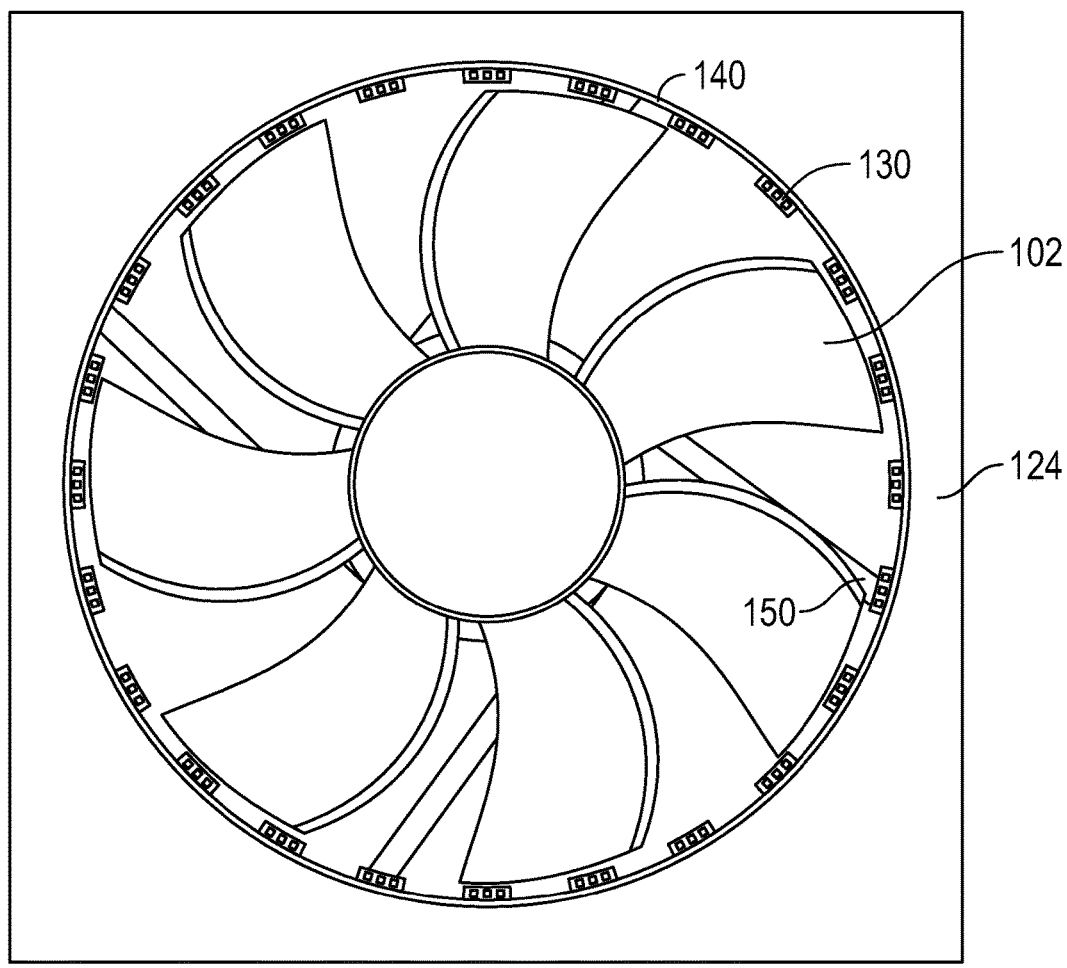
FIG. 1B is a top plan view of the illuminated fan with addressable LEDs.

FIG. 1A is a partially-exploded, partial-cutaway perspective view of a cooling fan 100 with addressable LEDs, in accordance with one embodiment. FIG. 1B illustrates fan 100 in top plan view. The fan 100 includes impeller 102, driven by an electric motor structure 110 formed from rotor 112 (attached to impeller 102), stator 114 and bearing 116. Impeller 102 and motor 110 are contained within central cavity 120 of frame 122. Multiple addressable LEDs 130 are positioned around an outside perimeter of central cavity 120, with their light emitting components facing inwards, towards impeller 102.

LEDs 130 are mounted onto flexible circuit substrate 140, shown in FIG. 1A in partial cutaway view. Substrate 140 also provides electrical paths for conveyance of power and control signals to LEDs 130. Substrate 140 forms a generally circular perimeter of central cavity 120, and also spans (and is generally perpendicular to) top frame plate 124 and bottom frame plate 126, thereby also serving as a shroud for impeller 102. Support arms 150 hold motor assembly 110 in place, while allowing air to pass through central cavity 120 and impeller 102. Connecting wires (not shown) supply power and signals from a connected controller to the motor 110 and addressable LED circuit substrata 140.

In some embodiments, LEDs 130 may be individually-addressable single-color LEDs, with control signals determining the on/off state of each LED over time. In such embodiments, LEDs 130 are preferably spaced relatively closely to one another, with neighboring LEDs having different colors, so that neighboring LEDs can be simultaneously illuminated to blend light color and create composite colors and effects on impeller 102. The desirable number and spacing of LEDs for such effects may depend on the diameter of central cavity 120 and/or impeller 102. A recommended minimum number of LEDs 130 is 8, spaced equally at 45 degree increments around the fan perimeter. In some embodiments, for a standard 120 mm by 120 mm fan, it may be desirable to include at least twelve LEDs 130, thereby having a spacing of at least 30 degrees, spaced equidistantly around the periphery of central cavity 120. In other embodiments, 120 mm square fans may even more preferably include 24 (as illustrated in FIGS. 1A and 1B), 36 or 48 LEDs 130, thereby providing additional visual effects and color blending options. However, it is understood that numerous fan sizes may be implemented having the same or different numbers of LEDs, including, without limitation, standard frame mounting sizes of 80mm; 92 mm; 120 mm; 140 mm; 180 mm; 200 mm; or 230 mm.

In some embodiments, LEDs 130 may be individually-addressable RGB (red, green, blue) LEDs, with control signals determining both the on/off state, as well as composite color, for each LED.

LEDs 130 are preferably positioned for even illumination of the blades of impeller 102. In some embodiments, LEDs 130 will be positioned approximately equidistant between the frame top plate 124 and frame bottom plate 126. If the centerline plane of impeller 102 is not equidistant between top plate 124 and bottom plate 126, it may instead be desirable for LEDs 130 to be positioned on a plane approximately coincident with the centerline of impeller 102.

Figure 2:
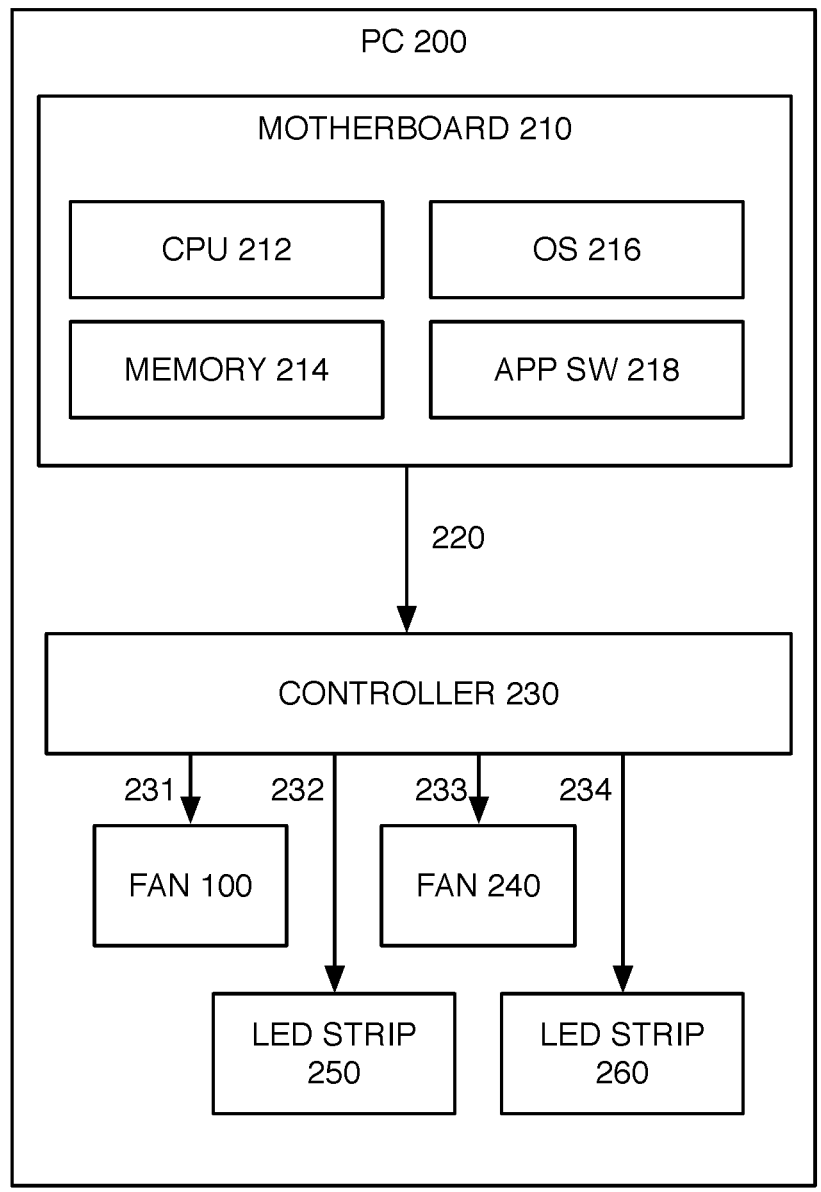
FIG. 2 is a schematic block diagram of the illuminated fan with addressable LEDs, implemented within a host electronic device.

FIG. 2 is a schematic block diagram of fan 100, as implemented in a host electronic device (in this case, personal computer 200). Fan 100 is typically mounted within a physical housing, along with other components of PC 200, and controller 230. PC 200 includes motherboard 210. Motherboard 210 includes central processing unit (CPU) 212, and memory 214. Memory 214 may include volatile memory, nonvolatile memory and combinations thereof. Memory 214 stores, amongst other things, operating system software 216 and application software 218, for execution by CPU 212.

Figure 3:
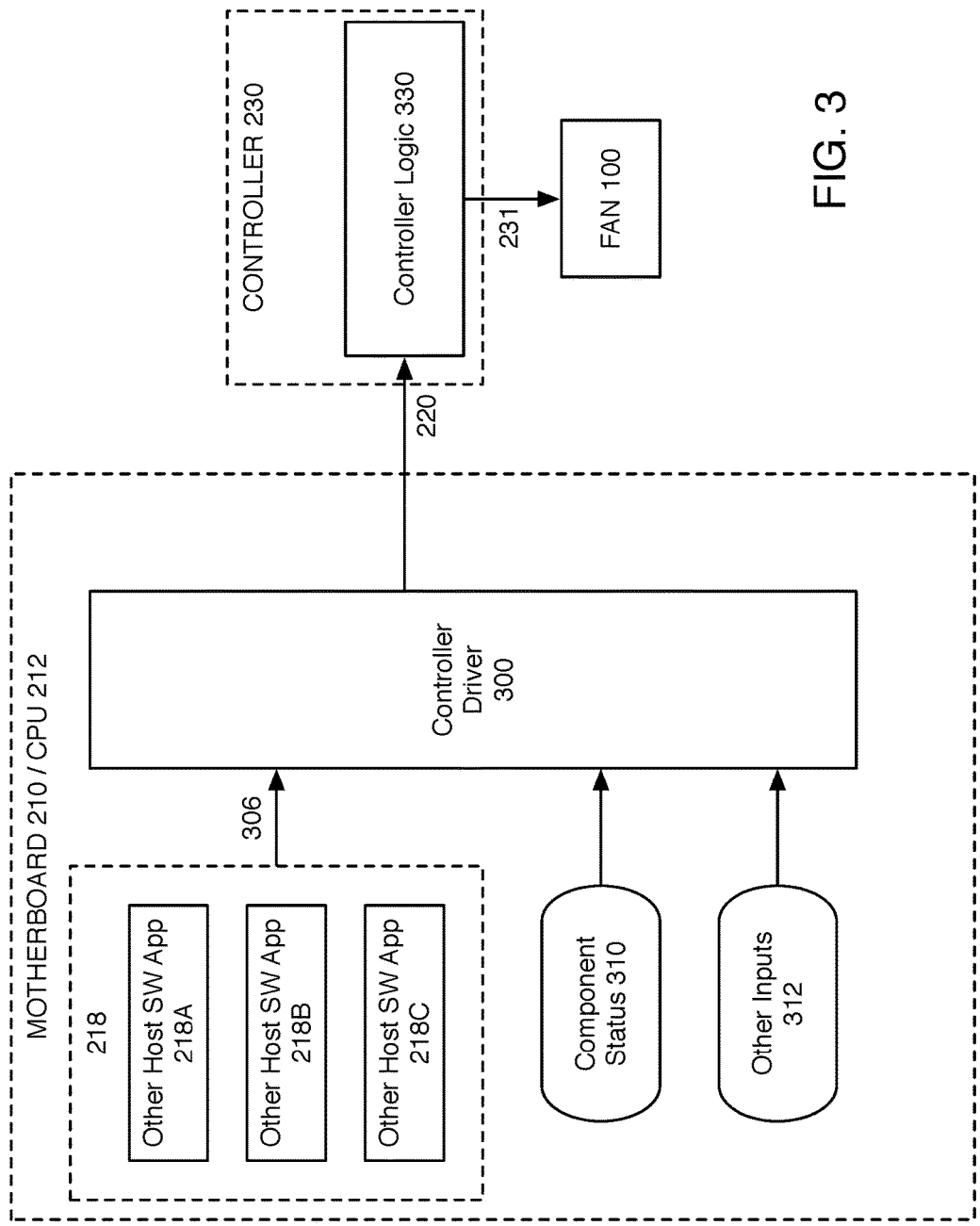
FIG. 3 is a schematic block diagram of a fan illumination control mechanism.

Control lines 220 extend from motherboard 210 to controller 230, which in turn controls the operation of fan 100 (such as motor rotation speed and LED illumination) via control line 231. FIG. 3 is a schematic representation of a software-based portions of the fan control mechanism. Controller driver 300 is implemented within the host electronic device, such as a TSR ("terminate stay resident") driver installed within OS 216 and implemented by CPU 212.

Driver 300 receives one or more inputs, such as input 306 generated by one or more software applications 218 implemented by the host electronic device 200; component status inputs 310 (e.g. CPU load, motherboard temperature, hard drive activity, memory utilization, etc.), some or all of which may be made available by OS 216; and/or other inputs 312 generated by or within the host electronic device 200. Driver 300 processes inputs 305, 310 and/or 312 to relay associated event data to controller 230 via control lines 220.

Controller 230 can be a standalone microprocessor-driven controller installed within a housing of the host electronic device, such as within the casing of a personal computer. Controller 230 processes event data relayed by driver 300 to generate control signals for addressable LED-based components installed within the host electronic device, including fan 100. In some embodiments, multiple accessories may be provided to maximize a user's creative flexibility in implementing the host electronic device. For example, in the embodiment of FIG. 2, case fan 100 is further supplemented by fan 240 (driven by control signal 233). In some embodiments, controller 230 will provide not only addressable LED control, but also power and fan speed control to fans 100 and 240. Also, standalone addressable LED strips 250 and 260 are driven by control signals 232 and 234, respectively, to provide further visual effects on or within the host electronic device.

Each addressable LED device 100, 240, 250 and 260 (and each individual addressable LED therein) is driven by programming of controller 230. Controller 230 receives host device event data relayed by driver 300, and outputs device-specific control signals, which may include time-variable fan speed signaling and/or time-variable LED illumination signaling. With regard to fan speed, fan motor 110 may be a variable-speed motor, such that control lines 231 provide control over the rotation speed of impeller 102. In some embodiments, the speed of motor 110 is controlled by voltage regulation, with a 3-wire control signal. In some embodiments, the speed of motor 110 is controlled by pulse width modulation, with a 4-wire control signal. These and other techniques for fan control are known in the art, and may be implemented by controller 230.

By using the array of LEDs 130 that are addressable by controller 230 and may be programmed to be responsive to event data from host device operating system 216 and application software 218, fan 100 may provide both cooling benefits to host PC 200, as well as avenues for artistic expression and/or information conveyance. For example, user can implement user-configurable software (implemented in controller 230) to express, with the color and speed of the fans or other effects, the status of host system components. Controller 230 can utilize host device component status data relayed from driver 300 (such as temperature, load, access and status of programs running on the host personal computer) to display different colors or other patterns on LEDs 130.

In one exemplary use case, fan 100 may be illuminated to reflect a processing load level experienced by CPU 212. Operating system 216 may include a mechanism to report CPU load levels to driver 300. Driver 300 relays CPU load level event data to controller 230 via control line 220. Controller 230 generates fan control signals conveyed by control lines 231 in order to vary illumination of LEDs 130 based on the CPU load level received by driver 300 (e.g., illuminating blue LEDs from amongst LEDs 130 at low CPU load levels, and progressively reducing the illumination of blue LEDs and increasing the illumination of red LEDs as CPU load levels increase).

On other use cases, users can implement custom lighting effects that are interactive with other applications running on the host system. For example, in some embodiments, host software application 218A may be an email application, with control signal 306 including event data indicative of whether unread email messages are present; in such an embodiment, controller logic 330 may cause controller 230 to output signal 231 driving LEDs 130 to illuminate a first color if email application 218A indicates that unread messages are present, and a second color if email application 218A indicates that no unread messages are present. Analogous operation can indicate presence of unread instant messages by an instant messaging application. These and other examples may be implemented whereby an outside application operating within a host electronic device generates event/status data relayed by driver 300 to controller 230, and utilized by controller logic 330 to control the operation of fan 100.

Further, it may also be desirable to have LED fans interact with game play on the host computer, thereby providing an additional dimension of real-world interaction with the game. Game application 218B may output gameplay-related event data to driver 300, which events are then in turn relayed to controller 230. For example, gameplay-related event data may include indication of when a player has been hit or damaged; such an event may cause controller logic 330 to temporarily illuminate LEDs 130 in the color red, thereby providing the player with an off-screen visual indication reflecting the on-screen event. As another example, gameplay-related event data may include an indication of in-game parameters, such as a user's relative health level; such an event may cause controller logic 330 to specify a color of steady state illumination for LEDs 130 that is reflective of the player's gameplay health level (e.g. Illumination of all LEDs surrounding the impeller indicating 100% health, and decreasingly the number of illuminated LEDs to indicate decreasing health levels). Other in-game parameters may include time remaining to complete an action, levels of remaining in-game resources, and the like.

In some embodiments, it would be desirable to have LED fans interact with music played on the host system. For example, driver 300 may relay to controller 230 a signal indicative of sound currently being generated by host device 200 (or extracted features of that sound), which signal may be in turn be processed by controller logic 330 to generate an addressable LED pattern derived therefrom and applied to LEDs 130.

Still further, it may be desirable to have LED fans that allow the user to implement custom lighting effects that may be created by the user, or installed on controller 230 by the end user, even after installation of controller 230 within host device 200 and potentially using a programming interface implemented on host device 200 itself. For example, host application 218C may be, e.g., a controller interface application that enables user programming and control over controller 230 (and controller logic 330) via driver 300 and control signal 220. A user can then use host electronic device 200, implementing application 218C, to create new lighting patterns and effects, and/or new interactions between system events and addressable LED lighting elements.

While certain embodiments of the invention have been described herein in detail for purposes of clarity and understanding, the foregoing description and Figures merely explain and illustrate the present invention and the present invention is not limited thereto. It will be appreciated that those skilled in the art, having the present disclosure before them, will be able to make modifications and variations to that disclosed herein without departing from the scope of the invention or any appended claims.

The invention claimed is:

1. A cooling fan for use in a host electronic device having a fan controller, the cooling fan comprising:
   a frame having a central cavity;
   an impeller positioned within the central cavity and driven by an electric motor; and
   a plurality of LEDs positioned around a periphery of the central cavity for illuminating the impeller, the LEDs individually-addressable by a fan controller, the fan controller driving time-variable individually-addressable illumination of each of the LEDs based on a digital signal generated by a host electronic device central processing unit and transmitted to the fan controller to control fan illumination.

2. The cooling fan of claim 1, in which the periphery of the central cavity is circular in cross-section.

3. The cooling fan of claim 2, in which the LEDs are positioned on a flexible circuit substrate forming a shroud around the impeller.

4. The cooling fan of claim 3, in which the LEDs are coplanar with a midline of the impeller.

5. The cooling fan of claim 2, in which the plurality of LEDs are equally spaced around the periphery of the central cavity, and in which an angular spacing between adjacent LEDs is within a range extending from 7.5 degrees to 45 degrees.

6. The cooling fan of claim 5, in which the plurality of LEDs are comprised of single-color LEDs having different colors, with adjacent LEDs each differing in color, whereby neighboring LEDs may be simultaneously illuminated by the host electronic device controller to blend light color.

7. The cooling fan of claim 1, in which the plurality of LEDs are each RGB LEDs, and in which the fan control input receives both illumination control signals and color specification signals for each LED from the host electronic device fan controller.

8. An electronic device comprising:
   a host personal computer comprising a central processing unit;
   a fan LED controller comprising a microprocessor, the fan LED controller receiving event data generated by, and transmitted digitally from the host personal computer central processing unit to control fan illumination, and outputting fan control signals derived from the event data; and
   a fan, the fan comprising: a frame having a central cavity; an impeller positioned within the central cavity and driven by an electric motor; and a plurality of individually-addressable LEDs positioned around a periphery of the central cavity for illuminating the impeller, the LEDs receiving the fan control signals from the fan LED controller to control individually-addressable illumination of the LEDs based on the event data from the host personal computer central processing unit.

9. The electronic device of claim 8, further comprising: a controller driver implemented within a host personal computer operating system running on the host personal computer central processing unit, to receive event data from the operating system and/or application software components running on the host personal computer central processing unit, the controller driver further generating an event data output that is conveyed to a fan LED controller input.

10. The electronic device of claim 9, in which the event data comprises temperature and load readings associated with one or more components of the host personal computer.

11. The electronic device of claim 9, in which the event data is generated by a first one of the application software components.

12. The electronic device of claim 8, in which the fan input further receives signals from the fan LED controller to control electric motor speed.

\* \* \* \* \*